United States Patent
Xu et al.

(10) Patent No.: US 9,843,014 B2
(45) Date of Patent: Dec. 12, 2017

(54) ELECTRONIC DEVICES WITH SAPPHIRE-COATED SUBSTRATES

(71) Applicant: Apple Inc., Cupertino, CA (US)

(72) Inventors: Tingjun Xu, San Jose, CA (US); Xianwei Zhao, Fremont, CA (US); Wookyung Bae, Santa Clara, CA (US); Sunggu Kang, San Jose, CA (US); John Z. Zhong, Saratoga, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/042,453

(22) Filed: Feb. 12, 2016

(65) Prior Publication Data

US 2016/0248051 A1     Aug. 25, 2016

Related U.S. Application Data

(60) Provisional application No. 62/118,983, filed on Feb. 20, 2015.

(51) Int. Cl.
   B05D 5/12      (2006.01)
   H01L 51/52     (2006.01)
   (Continued)

(52) U.S. Cl.
   CPC .......... H01L 51/524 (2013.01); C23C 14/081 (2013.01); C23C 14/5813 (2013.01);
   (Continued)

(58) Field of Classification Search
   CPC . H01L 51/524; C23C 14/081; C23C 14/5813; G02F 1/133308; G02F 2001/133331
   See application file for complete search history.

(56) References Cited

U.S. PATENT DOCUMENTS 3,859,714 A *   1/1975   DeLuca ............... C30B 29/20
                                                156/89.12
4,046,618 A †   9/1977   Chaudhari
                (Continued)

FOREIGN PATENT DOCUMENTS

WO        2014126777        8/2014

OTHER PUBLICATIONS

Chaudhari, Crystalline Al2O3 on Buffered Soda-Lime Glass by E-Beam, pp. 407-410, 2014, Materials Letters 136, Elsevier, US. Statements.†

(Continued)

Primary Examiner — Vongsavanh Sengdara
(74) Attorney, Agent, or Firm — Treyz Law Group, P.C.; Kendall W. Abbasi

(57) ABSTRACT

An electronic device may have a display that is protected by a transparent cover layer. The transparent cover layer may include a laser-annealed sapphire coating on the outer surface of a glass substrate or other transparent substrate. The sapphire coating may provide the display with a hard, scratch-resistant outer surface. The sapphire coating may be formed by coating a glass substrate with a thin film of amorphous aluminum oxide. The aluminum oxide thin film may be locally heated to transform the amorphous aluminum oxide into alpha-phase aluminum oxide (sapphire). Local heating may be achieved by laser annealing the aluminum oxide coating with a carbon dioxide laser. The laser may produce laser light having a wavelength that is absorbed in the aluminum oxide coating without being absorbed by the glass substrate so that the glass substrate is not damaged during the laser annealing process.

16 Claims, 6 Drawing Sheets

(51) Int. Cl.
  *C23C 14/08* (2006.01)
  *C23C 14/58* (2006.01)
  *G02F 1/1333* (2006.01)
(52) U.S. Cl.
  CPC .............. *G02F 1/133308* (2013.01); *G02F 2001/133331* (2013.01)

(56) References Cited

U.S. PATENT DOCUMENTS

| | | | |
|---|---|---|---|
| 9,092,187 | B2 | 7/2015 | Kwong |
| 9,356,171 | B2 † | 5/2016 | Liu |
| 2004/0038465 | A1* | 2/2004 | Shimomura ........ H01L 21/2026 438/166 |
| 2004/0040654 | A1* | 3/2004 | Masuda ................ C04B 35/645 156/308.6 |
| 2008/0088568 | A1* | 4/2008 | Haga ........................ G09G 3/18 345/100 |
| 2009/0229335 | A1* | 9/2009 | Carsley ................ B21D 39/021 72/306 |
| 2010/0079384 | A1* | 4/2010 | Grivna .................... G06F 3/041 345/173 |
| 2012/0017642 | A1* | 1/2012 | Teranishi ............. B28D 5/0011 65/105 |
| 2013/0098113 | A1* | 4/2013 | Kuwahara ............. C03C 17/002 65/60.52 |
| 2014/0116329 | A1 † | 5/2014 | Chaudhari |
| 2014/0160648 | A1 | 6/2014 | Chang |
| 2014/0185202 | A1 | 7/2014 | Schmid |
| 2014/0327624 | A1* | 11/2014 | Srinivas ................ G06F 1/1626 345/173 |
| 2015/0267289 | A1 † | 9/2015 | Vispute |
| 2015/0324042 | A1* | 11/2015 | Hu .......................... B32B 27/32 345/173 |
| 2016/0024639 | A1 | 1/2016 | Cheah et al. |
| 2017/0197887 | A1 | 7/2017 | Vispute et al. |

OTHER PUBLICATIONS above-identified.†

* cited by examiner
† cited by third party

ELECTRONIC DEVICES WITH SAPPHIRE-COATED SUBSTRATES

This application claims the benefit of U.S. provisional patent application No. 62/118,983, filed Feb. 20, 2015, which is hereby incorporated by reference herein in its entirety.

BACKGROUND

This relates generally to electronic devices and, more particularly, to electronic devices with displays.

Electronic devices often include displays. For example, cellular telephones and portable computers often include displays for presenting information to a user.

Displays are typically provided with a protective cover layer such as a layer of glass. The glass protects the display from moisture ingress and other contaminants while providing a surface through which images can be displayed.

If care is not taken, the glass cover layer of a display can become scratched, cracked, or shattered. To reduce scratching, some glass cover layers are chemically strengthened via ion exchange, in which sodium ions in the glass surface are replaced by potassium ions from a potassium salt bath. The ion exchange causes the surface of the glass to be compressed while the core of the glass is in a state of tension.

However, even chemically strengthened glass can provide unsatisfactory scratch resistance, and scratches on the display are likely to lead to future cracks and shattering.

It would therefore be desirable to be able to provide improved displays for electronic devices such as displays with improved scratch resistance.

SUMMARY

An electronic device may be provided with a housing such as a metal housing in which a display is mounted. The display may be protected by a transparent cover layer. The transparent cover layer may include a laser-annealed sapphire coating on the outer surface of a transparent substrate (e.g., a glass substrate). The sapphire coating may provide the display with a hard, scratch-resistant outer surface. Display layers such as an organic light emitting diode display module may be laminated to the inner surface of the transparent substrate.

The sapphire coating may be formed by coating a surface of a transparent substrate such as a glass substrate with a thin film of amorphous aluminum oxide and/or other materials such as aluminum oxygen nitride. The amorphous aluminum oxide may have a thickness between 0.01 microns and 10 microns or may have other suitable thickness. The amorphous aluminum oxide may be locally heated to transform the amorphous aluminum oxide into alpha-phase aluminum oxide (also known as sapphire).

Local heating may be achieved by laser annealing the aluminum oxide coating with a carbon dioxide laser. The laser may produce laser light having a wavelength (e.g., 10.6 microns) that is absorbed in the aluminum oxide coating without being absorbed by the glass substrate to avoid damaging the glass substrate during the laser annealing process. The laser annealing process may raise the temperature of the aluminum oxide to above 1000° C. at which point the aluminum oxide becomes sapphire.

After the sapphire coating is formed on the glass substrate, the glass substrate may be assembled with other display layers to form a display. The display may be assembled with other components in a housing to form an assembled electronic device.

DETAILED DESCRIPTION

Electronic devices may include displays. The displays may be used to display images to a user. Illustrative electronic devices that may be provided with displays are shown in FIGS. 1, 2, 3, and 4.

Figure 1:
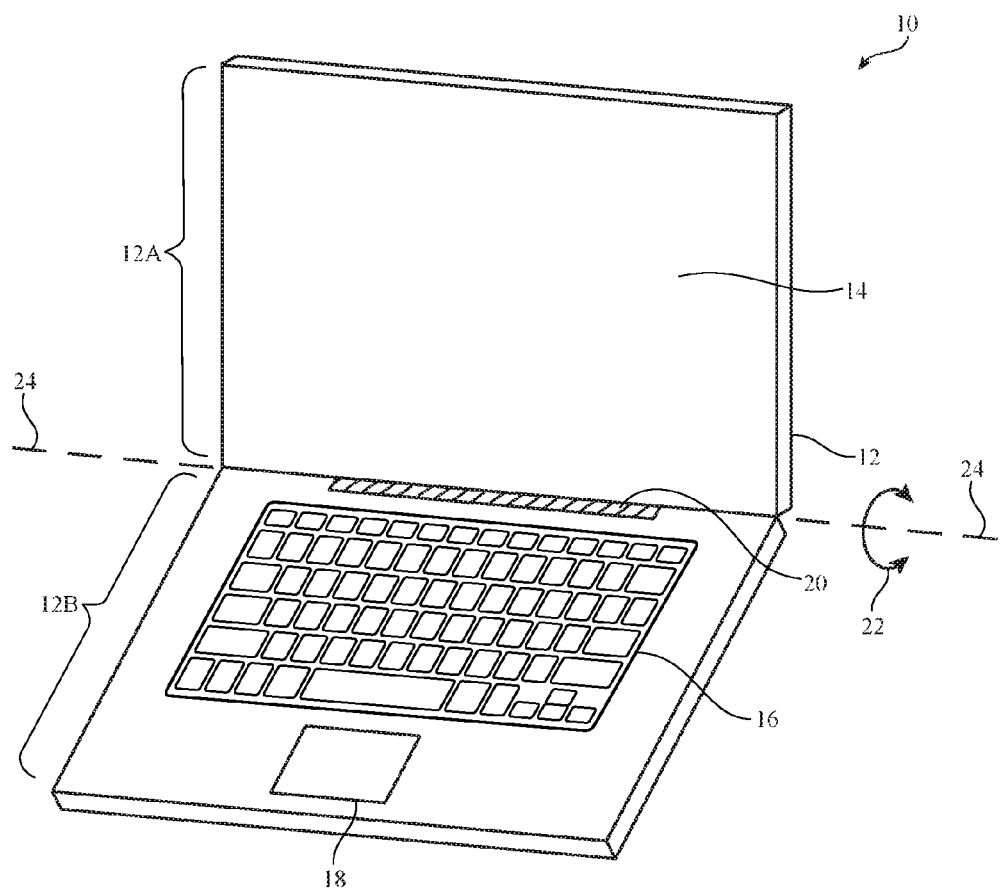
FIG. 1 is a perspective view of an illustrative electronic device such as a laptop computer with a display in accordance with an embodiment of the present invention.

FIG. 1 shows how electronic device 10 may have the shape of a laptop computer having upper housing 12A and lower housing 12B with components such as keyboard 16 and touchpad 18. Device 10 may have hinge structures 20 that allow upper housing 12A to rotate in directions 22 about rotational axis 24 relative to lower housing 12B. Display 14 may be mounted in upper housing 12A. Upper housing 12A, which may sometimes be referred to as a display housing or lid, may be placed in a closed position by rotating upper housing 12A towards lower housing 12B about rotational axis 24.

Figure 2:
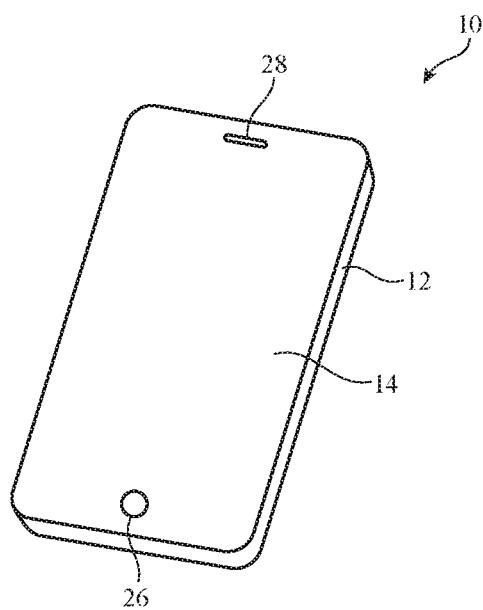
FIG. 2 is a perspective view of an illustrative electronic device such as a handheld electronic device with a display in accordance with an embodiment of the present invention.

FIG. 2 shows how electronic device 10 may be a handheld device such as a cellular telephone, music player, gaming device, navigation unit, or other compact device. In this type of configuration for device 10, housing 12 may have opposing front and rear surfaces. Display 14 may be mounted on a front face of housing 12. Display 14 may, if desired, have openings for components such as button 26. Openings may also be formed in display 14 to accommodate a speaker port (see, e.g., speaker port 28 of FIG. 2).

Figure 3:
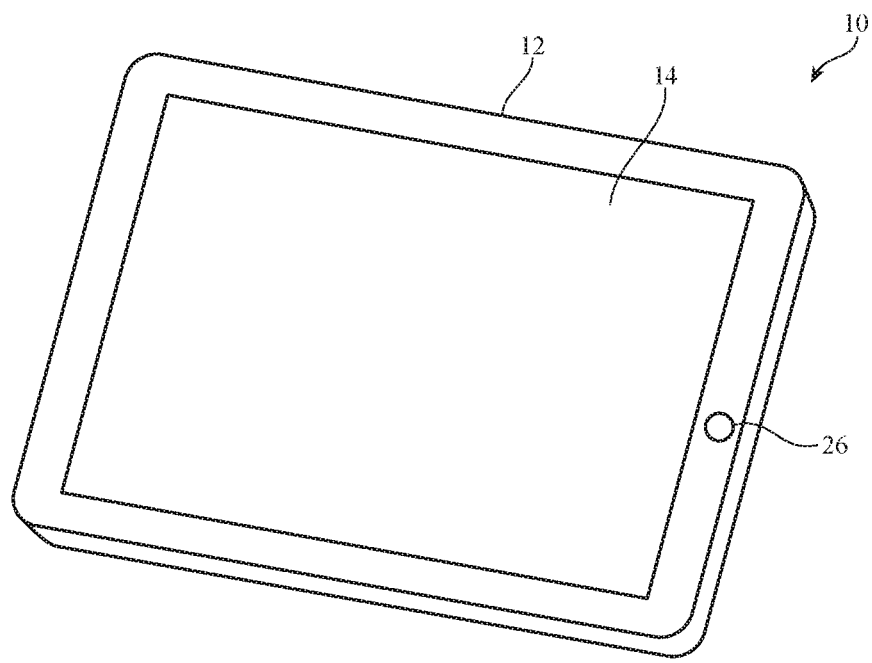
FIG. 3 is a perspective view of an illustrative electronic device such as a tablet computer with a display in accordance with an embodiment of the present invention.

FIG. 3 shows how electronic device 10 may be a tablet computer. In electronic device 10 of FIG. 3, housing 12 may have opposing planar front and rear surfaces. Display 14 may be mounted on the front surface of housing 12. As shown in FIG. 3, display 14 may have an opening to accommodate button 26 (as an example).

Figure 4:
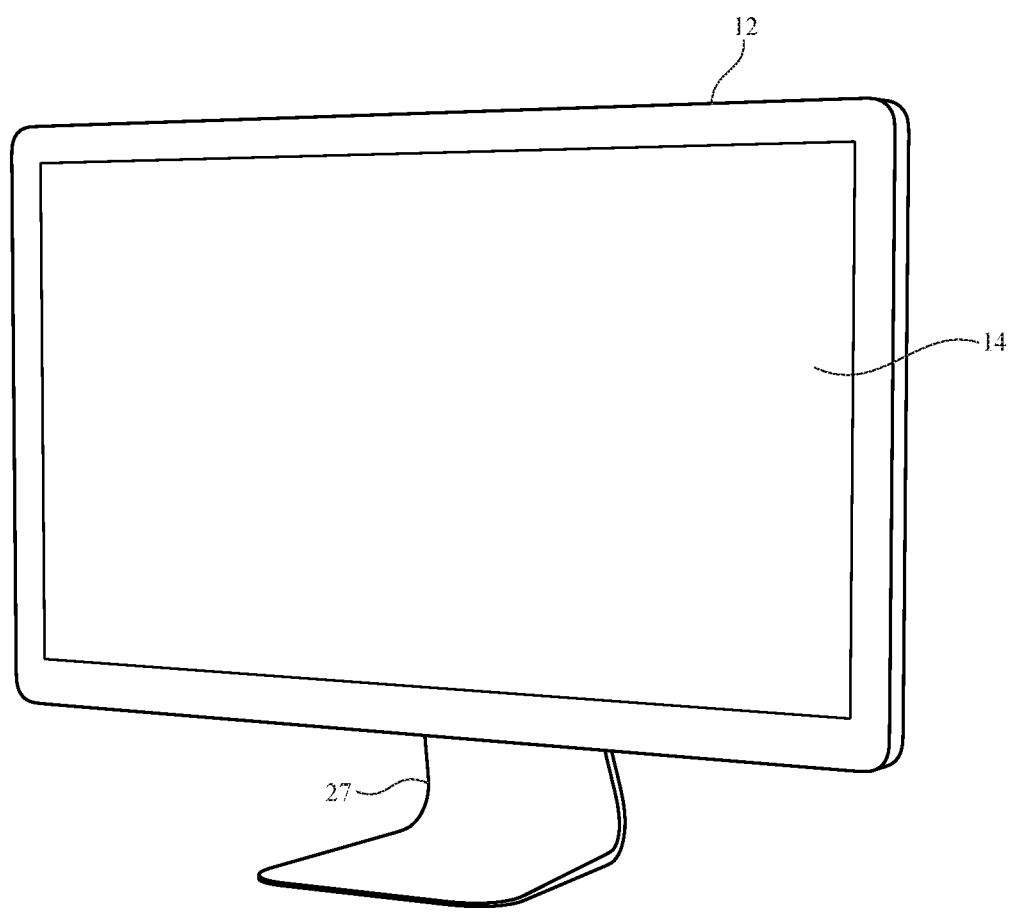
FIG. 4 is a perspective view of an illustrative electronic device such as a computer with a display in accordance with an embodiment of the present invention.

FIG. 4 shows how electronic device 10 may be a computer display or a computer that has been integrated into a computer display. With this type of arrangement, housing 12 for device 10 may be mounted on a support structure such as stand 27. Display 14 may be mounted on a front face of housing 12.

The illustrative configurations for device 10 that are shown in FIGS. 1, 2, 3, and 4 are merely illustrative. In general, electronic device 10 may be a laptop computer, a computer monitor containing an embedded computer, a tablet computer, a cellular telephone, a media player, or other handheld or portable electronic device, a smaller device such as a wrist-watch device, a pendant device, a headphone or earpiece device, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment.

Housing 12 of device 10, which is sometimes referred to as a case, may be formed of materials such as plastic, glass, ceramics, carbon-fiber composites and other fiber-based composites, metal (e.g., machined aluminum, stainless steel, or other metals), other materials, or a combination of these materials. Device 10 may be formed using a unibody construction in which most or all of housing 12 is formed from a single structural element (e.g., a piece of machined metal or a piece of molded plastic) or may be formed from multiple housing structures (e.g., outer housing structures that have been mounted to internal frame elements or other internal housing structures).

Display 14 may be a touch screen display that incorporates a layer of conductive capacitive touch sensor electrodes or other touch sensor components (e.g., resistive touch sensor components, acoustic touch sensor components, force-based touch sensor components, light-based touch sensor components, etc.) or may be a display that is not touch-sensitive. Capacitive touch screen electrodes may be formed from an array of indium tin oxide pads or other transparent conductive structures.

Display 14 may include an array of pixels formed from liquid crystal display (LCD) components, an array of electrophoretic pixels, an array of plasma pixels, an array of organic light-emitting diode pixels, an array of electrowetting pixels, an array of micro-light-emitting diodes, or pixels based on other display technologies.

The outer surface of display 14 may be formed by a display cover layer or a different display layer such as a color filter layer, polarizer layer, polymer film, or other portion of display 14 may be used as the outermost (or nearly outermost) layer in display 14. The outermost display layer may be formed from a sapphire-coated substrate. The substrate that is coated with sapphire may be a transparent glass sheet, a clear plastic layer, a clear ceramic layer, or other suitable transparent member.

Figure 5:
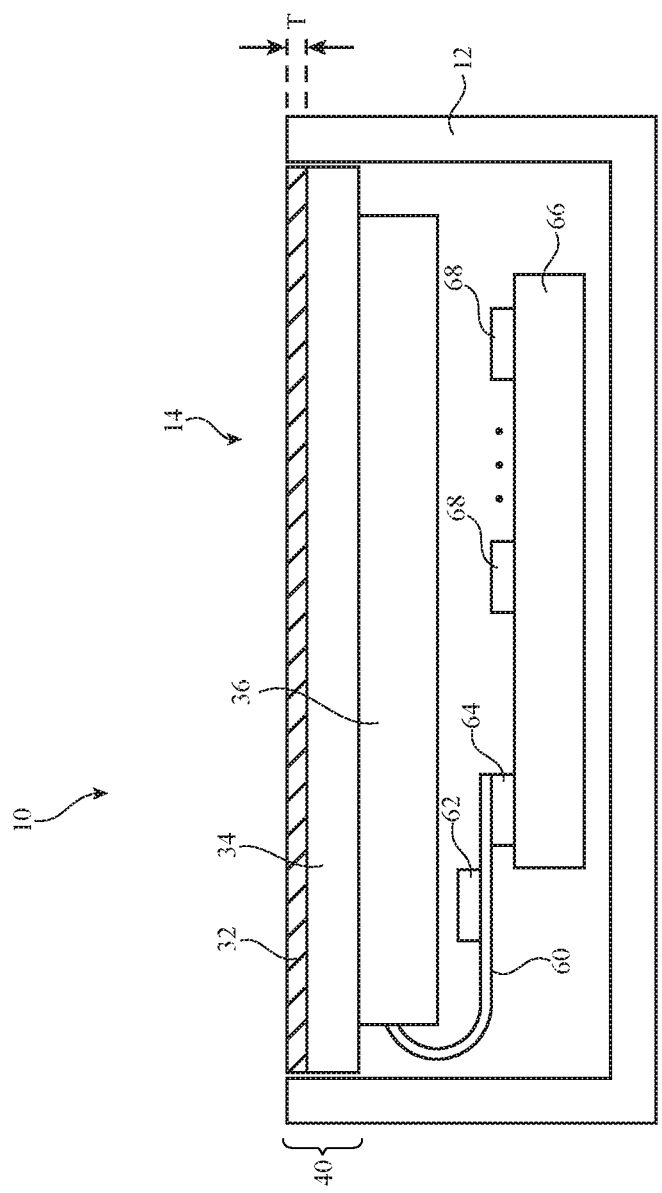
FIG. 5 is a cross-sectional side view of an illustrative electronic device having a display with a cover layer formed from a sapphire-coated substrate in accordance with an embodiment of the present invention.

A cross-sectional side view of an illustrative electronic device having a cover layer formed from a sapphire-coated substrate is shown in FIG. 5. As shown in FIG. 5, device 10 may include housing 12. Display 14 may be mounted in or on housing 12.

Display 14 may include display module 36. Display module 36 (sometimes referred to as display structures 36) may be a liquid crystal display (LCD) module, an array of electrophoretic pixels, a layer of plasma pixels, an array of organic light-emitting diode pixels, an array of electrowetting pixels, or one or more display layers based on other display technologies.

Device 10 may include substrates with signal lines. For example, device 10 may include one or more printed circuits. Printed circuits in device 10 may include rigid printed circuits (e.g., printed circuits formed from fiberglass-filled epoxy or other rigid printed circuit board material) and flexible printed circuits (e.g., printed circuits formed from flexible substrate materials such as flexible sheets of polyimide or layers of other flexible polymers). As shown in FIG. 5, components 68 may be mounted on printed circuit 66. Printed circuit 66 may be a rigid printed circuit or a flexible printed circuit. Components 68 may include one or more integrated circuits or other electrical components. Components 68 may, for example, include storage such as hard disk drive storage, nonvolatile memory (e.g., flash memory or other electrically-programmable-read-only memory configured to form a solid state drive), volatile memory (e.g., static or dynamic random-access-memory), etc. Components 68 may also include processing circuitry that is used to control the operation of device 10. This processing circuitry may be based on one or more microprocessors, microcontrollers, digital signal processors, baseband processor integrated circuits, application specific integrated circuits, a system-on-chip integrated circuit, etc.

The control circuitry of device 10 (e.g., the storage and processing circuitry formed from components such as components 68 on printed circuit 66) may be used to run software on device 10 such as internet browsing applications, voice-over-internet-protocol (VOIP) telephone call applications, email applications, media playback applications, operating system functions, game applications, maps, etc. During operation, the circuitry of device 10 may gather input from input-output devices and may supply output (e.g., to a user or to an electronic device) using input-output devices. These input output devices may include user interface devices, data port devices, and other input-output components. For example, the input-output devices of device 10 may include touch screens, displays without touch sensor capabilities, buttons, joysticks, scrolling wheels, touch pads, key pads, keyboards, microphones, cameras, speakers, status indicators, light sources, audio jacks and other audio port components, digital data port devices, light sensors, accelerometers or other components that can detect motion and device orientation relative to the Earth, capacitance sensors, proximity sensors (e.g., a capacitive proximity sensor and/or an infrared proximity sensor), magnetic sensors, a connector port sensor or other sensor that determines whether device 10 is mounted in a dock, and other sensors and input-output components. Wireless communications circuitry (e.g., antennas, transceivers, etc.) may be used to send and receive wireless signals.

The circuitry on printed circuit 66 may include a system-on-chip (SOC) integrated circuit, application-specific integrated circuits, microprocessors, memory, and other control circuits that generate image data to be displayed on display 14. Image data from the system-on-chip integrated circuit or other control circuit may be supplied to display driver integrated circuit 62 using flexible printed circuit 60. Flexible printed circuit 60 may be coupled to printed circuit 66 using board-to-board connector 64 or other suitable connection. Using signal paths such as metal traces in flexible printed circuit 60, control circuitry in components 68 (e.g., a system-on-chip integrated circuit, etc.) can supply image data to display driver circuitry 62. Display driver circuitry 62 can receive and process this image data and can generate corresponding data line signals and other signals for controlling the operation of the array of pixels in display module 36.

As shown in FIG. 5, display structures 36 may be covered by a protective layer such as transparent display cover layer

40. Display cover layer 40 may help to protect underlying display structures such display structures 36. Display structures 36 may be laminated to the lower surface of display cover layer 40 or may otherwise be mounted under display cover layer 40.

Display cover layer 40 may include substrate 34 with an outer coating such as coating layer 32. Substrate 34 may be a clear layer of material such as a layer of transparent glass, sapphire or other crystalline materials, clear plastic, transparent ceramic, other transparent materials, or combinations of these materials (e.g., one or more clear sheets of material). Arrangements in which substrate 34 is a glass substrate are sometimes described herein as an illustrative example.

Openings may be formed in the display cover layer. For example, openings may be formed in the display cover layer to accommodate buttons, speakers, or other components. Openings may be formed in housing 12 to form communications ports (e.g., an audio jack port, a digital data port, etc.). Openings in housing 12 may also be formed for audio components such as a speaker and/or a microphone or other components.

Coating 32 may be a thin coating of sapphire or other crystalline material that provides display cover layer 40 with a tough outer surface that resists scratches and fractures better than substrate 34. Sapphire coating layer 32 may have a thickness T between 0.01 microns and 10 microns, between 10 microns and 50 microns, between 20 microns and 30 microns, between 50 microns and 100 microns, less than one micron, or other suitable thickness.

Sapphire layer 32 may be formed by coating the surface of glass substrate 34 with amorphous aluminum oxide ($Al_2O_3$) and/or similar materials such as aluminum oxygen nitride (sometimes referred to as aluminum oxynitride) and then applying heat to transform the aluminum oxide into alpha-phase aluminum oxide ($\alpha$-$Al_2O_3$), thereby forming a sapphire coating directly on the surface of glass 34.

Figure 6:
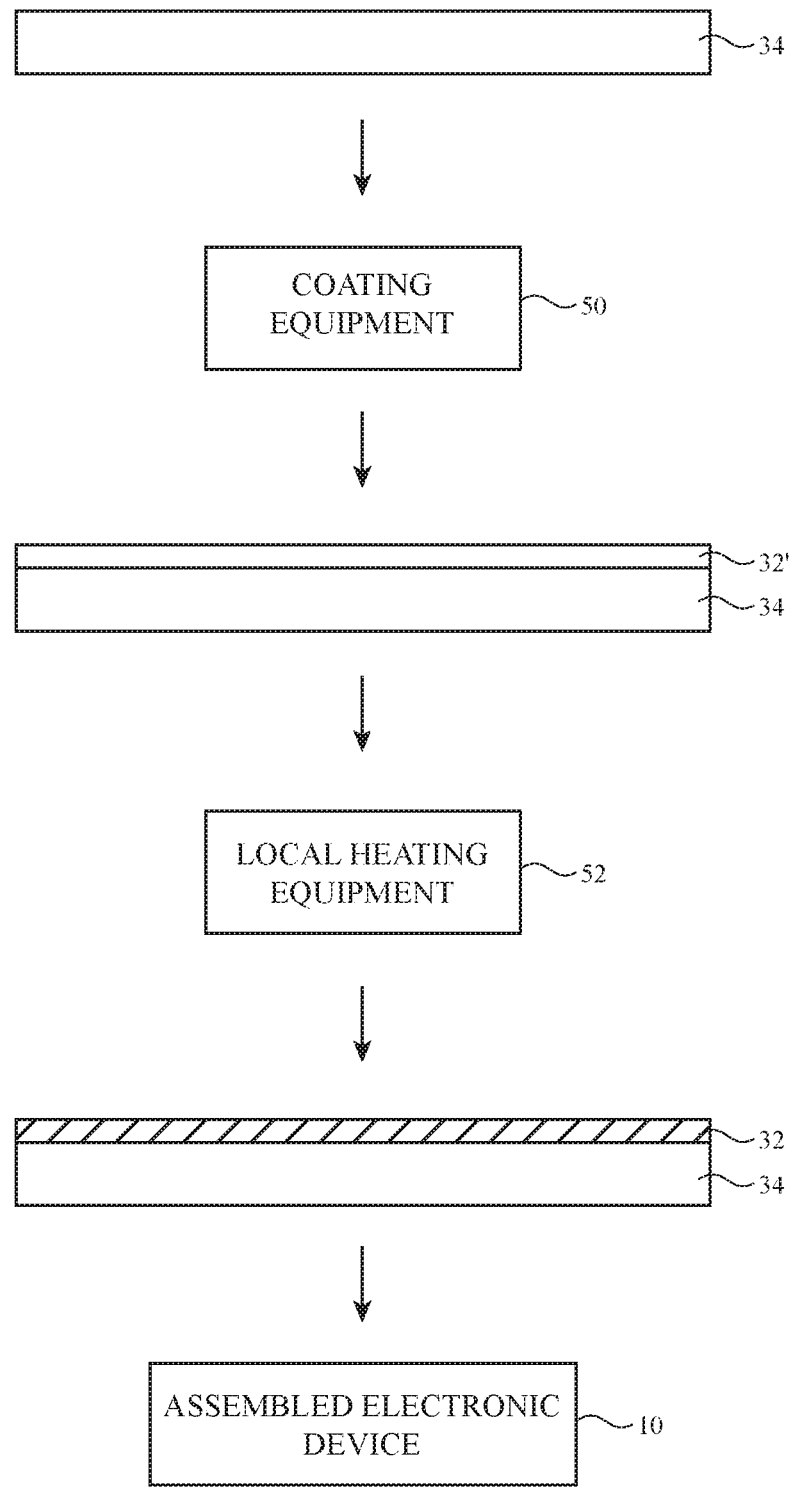
FIG. 6 is a diagram showing illustrative steps involved in forming an electronic device having a display cover layer formed from a sapphire-coated substrate in accordance with an embodiment of the present invention.

A diagram showing illustrative steps involved in forming a crystallized coating directly on the surface of a substrate such as a glass substrate is shown in FIG. 6.

As shown in FIG. 6, coating equipment such as coating equipment 50 may be used to coat the upper surface of substrate 34 with coating 32'. Coating 32' may be a thin film of amorphous or polycrystalline aluminum oxide, aluminum oxynitride (AlON), magnesium aluminate spinel, other suitable transparent ceramic material, or a combination of any two or more of these materials. In some arrangements, coating 32' may be a film that includes both aluminum oxide ($Al_2O_3$) and aluminum oxynitride. The aluminum oxynitride may help improve light absorption in coating 32'. Arrangements in which coating 32' is an aluminum oxide coating are sometimes described herein as an illustrative example. Coating equipment 50 may include chemical vapor deposition equipment, physical vapor deposition equipment, sputtering equipment, electron beam or thermal evaporation equipment, atomic layer deposition equipment, aerosol jet equipment, plasma deposition equipment, thermal spraying equipment, or other suitable coating equipment.

Following application of coating 32' on substrate 34, local heating equipment 52 may apply heat to coating 32' to raise the temperature of coating 32' above 1000° Celsius. Raising the temperature of the amorphous or polycrystalline aluminum oxide may transform coating 32' into alpha-phase aluminum oxide to form sapphire coating 32.

To avoid damaging glass substrate 34 during heating, local heating equipment 52 may locally heat coating 32' while maintaining the temperature of substrate 34 below its melting point. For example, local heating equipment may include laser annealing equipment that scans a laser beam onto coating 32' to locally heat coating 32'. The laser light may have a wavelength that is absorbed more by coating 32' than by glass layer 34. For example, equipment 52 may include a carbon dioxide laser that produces a laser beam having a wavelength between 9 and 11 microns (e.g., 10.6 microns). Coating 32' may exhibit relatively high absorption in this range of wavelengths while glass substrate 34 may exhibit relatively low absorption in this range of wavelengths. This is, however, merely illustrative. If desired, laser beams having other suitable wavelengths may be used to locally heat coating 32'.

If desired, local heating equipment 52 may include other heating equipment such as flash lamp annealing equipment, infrared heating lamps, other lamps, other annealing equipment, equipment that generates hot air, etc. Arrangements in which local heating equipment 52 includes laser annealing equipment are sometimes described herein as an example.

After forming sapphire coating 32 on transparent substrate 34 to form cover layer 40, cover layer 40 may be assembled with other display layers (e.g., display module 36 of FIG. 5). This may include, for example, laminating display layers 36 to cover layer 40 or otherwise mounting cover layer 40 over display layers 36. Display 14 and other components (e.g., components 66 of FIG. 5) may be assembled in housing 12 to form assembled electronic device 10.

Figure 7:
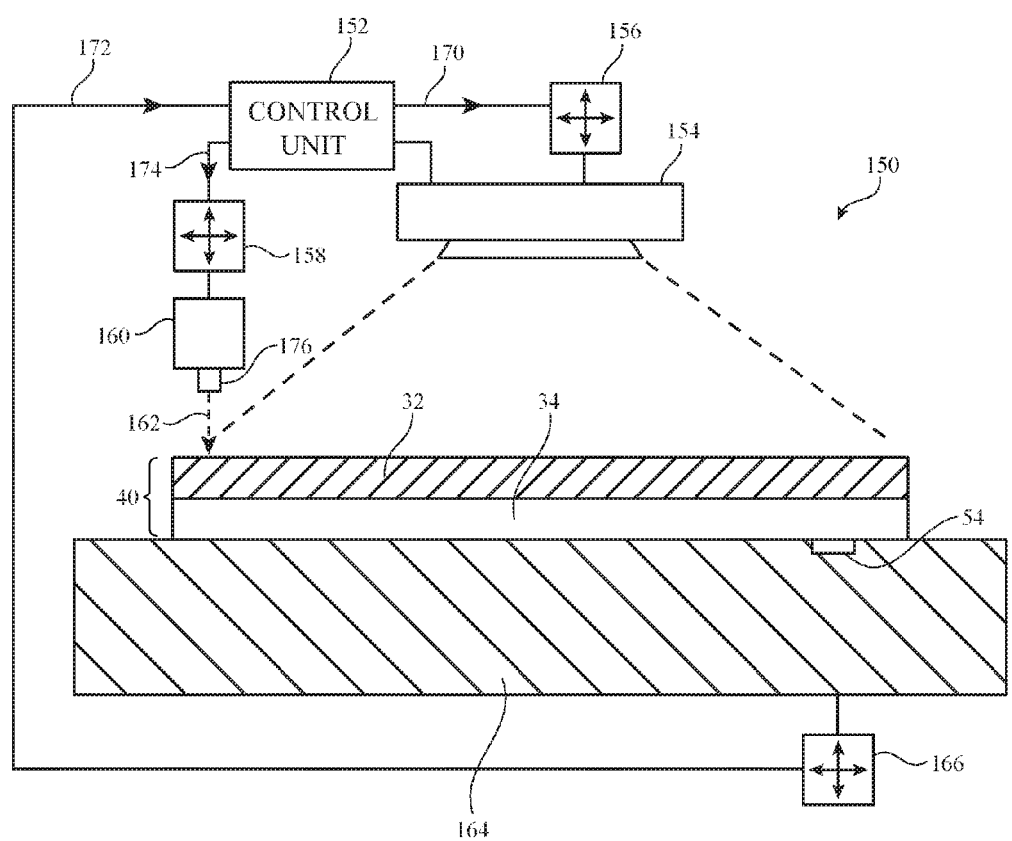
FIG. 7 is a diagram of an illustrative system in which laser-based local heating equipment is being used to transform an aluminum oxide coating on a substrate into crystalline sapphire with minimal thermal impact on the substrate in accordance with an embodiment of the present invention.

FIG. 7 is a diagram of an illustrative system including laser annealing equipment that may be used to locally heat coating layer 32' to form sapphire coating 32. In a configuration of the type shown in FIG. 7, system 150 may include a camera such as camera 154 for capturing images of cover layer 40. Camera 154 may include an image sensor that captures digital image data for processing by control unit 152. Layers 34 and 32 are supported by support structures 164 during laser annealing operations. If desired, system 150 may include a temperature sensor 54 on substrate 34 that measures the temperature of substrate 34 during laser annealing. Control unit 152 may gather temperature information from sensor 54 during laser annealing so that laser annealing operations can be paused if the temperature of substrate 34 surpasses a given temperature threshold.

Data from camera 154 is analyzed by control unit 152 to determine the position of cover layer 40 relative to laser 160 and laser beam 162. Laser 160 may, for example, be an infrared leaser such as a carbon dioxide laser operating at a wavelength of 10.6 microns, 9.6 microns, or other suitable wavelength. Control unit 152 may be one or more computers, embedded processors, networked computing equipment, online computing equipment, and/or other computing equipment for processing digital image data from camera 154 or other sensors to determine the location of cover layer 40 and for issuing corresponding control signals on outputs 170, 172, and 174.

The control signals on outputs 170, 172, and 174 control the operation of computer-controlled positioners 156, 166, and 158, respectively. For example, control commands on path 170 control the operation of positioner 156, which is used in adjusting the position of camera 154. Control signals on path 172 are used in controlling the operation of positioner 166, which is used in adjusting the position of support 164 (and therefore layer 40) relative to laser beam 162. Control signals on line 174 are used to control positioner 158 and thereby adjust the position of laser 160 and laser beam 162 relative to layer 40. If desired, different arrangements of positioners may be used. As an example, the position of machine vision equipment such as camera 154 may be fixed and/or positioner 158 and/or positioner 166 may be omitted. Additional positioners (e.g. to control mirrors or other optical structures that direct beam 162 onto layer 40) may also be used. If desired, imaging equipment such as camera 154 may be omitted. The configuration of FIG. 7 is shown as an example.

During laser annealing operations, control unit 152 may move laser 160 and/or stage 164 to scan laser beam 162 back and forth across coating 32' (FIG. 6). As laser beam 162 moves across coating 32', the temperature of coating 32' may rise above 1000° Celsius (e.g., to 1050° Celsius, above 1050° Celsius, below 1050° Celsius, etc.), thereby transforming amorphous or polycrystalline aluminum oxide 32' into sapphire 32. Even though the temperature of coating 32 is raised above the melting point temperature of glass, glass substrate 34 may experience minimal thermal impact during laser annealing because laser light 162 may be absorbed in upper coating 32.

If desired, characteristics of laser beam 162 may be modified to reduce any thermal impact on glass substrate 34 during local heating of coating 32. For example, optical structures within laser 160 such as lens 176 may be modified to produce a laser beam of a desired spot size. Other components and/or settings that may be changed to adjust the laser energy density include the optical power output (e.g., the average power output in the case of a pulsed or modulated laser or the continuous power output in the case of a continuous wave laser) of laser 160, the type of laser 160 used in system 150 (e.g., gas laser, solid-state laser, dye laser, semiconductor laser, or other suitable type of laser), the wavelength of light emitted by laser 160 (e.g., wavelengths in the ultraviolet range, wavelengths in the visible range, wavelengths in the infrared range, etc.), the pulse duration and/or pulse frequency of laser 160 (in arrangements where laser 160 is a pulsed laser), the position of laser 160 relative cover layer 40, the current applied to laser 160, other suitable components and settings, etc.

The foregoing is merely illustrative and various modifications can be made by those skilled in the art without departing from the scope and spirit of the described embodiments. The foregoing embodiments may be implemented individually or in any combination.

What is claimed is:

1. A method for forming a display cover layer, comprising:
    coating a surface of a transparent substrate with aluminum oxide; and
    locally heating the aluminum oxide to transform the aluminum oxide into sapphire, wherein locally heating the aluminum oxide comprises locally heating the aluminum oxide without heating the transparent substrate.

2. The method defined in claim 1 wherein the aluminum oxide comprises amorphous aluminum oxide and wherein locally heating the aluminum oxide comprises laser annealing the amorphous aluminum oxide to transform the amorphous aluminum oxide into sapphire.

3. The method defined in claim 1 wherein the transparent substrate comprises glass.

4. The method defined in claim 1 wherein the transparent substrate comprises polymer.

5. The method defined in claim 1 wherein coating the surface of the transparent substrate with aluminum oxide comprises coating the surface of the transparent substrate with aluminum oxide using coating equipment selected from the group consisting of: chemical vapor deposition equipment, physical vapor deposition equipment, sputtering equipment, electron beam evaporation equipment, thermal evaporation equipment, atomic layer deposition equipment, aerosol jet equipment, plasma deposition equipment, and thermal spraying equipment.

6. The method defined in claim 1 wherein locally heating the aluminum oxide comprises applying laser light to the aluminum oxide using a carbon dioxide laser.

7. The method defined in claim 6 wherein the laser light produced by the carbon dioxide laser has a wavelength of 10.6 microns.

8. The method defined in claim 1 wherein coating the surface of the transparent substrate with aluminum oxide comprises forming a coating of aluminum oxide on the surface of the transparent substrate, wherein the coating has a thickness between 0.01 microns and 10 microns.

9. The method defined in claim 1 wherein locally heating the aluminum oxide comprises raising a temperature of the aluminum oxide to above 1000° Celsius.

10. A method for forming a display, comprising:
    forming a film on a glass substrate, wherein the film includes aluminum oxide and aluminum oxynitride;
    laser annealing the aluminum oxide to form a sapphire coating on the glass substrate; and
    assembling display layers with the glass substrate such that the glass substrate is interposed between the sapphire coating and the display layers.

11. The method defined in claim 10 wherein laser annealing the aluminum oxide comprises raising a temperature of the aluminum oxide to above 1000° Celsius.

12. The method defined in claim 10 wherein the film has a thickness between 0.01 microns and 10 microns.

13. The method defined in claim 10 wherein laser annealing the aluminum oxide comprises laser annealing the aluminum oxide with a carbon dioxide laser.

14. The method defined in claim 10 wherein laser annealing the aluminum oxide comprises applying laser light to the aluminum oxide, where the laser light has a wavelength that is absorbed by the aluminum oxide and that is not absorbed by the glass substrate.

15. The method defined in claim 14 wherein the wavelength is between 9 and 11 microns.

16. The method defined in claim 10 wherein laser annealing the aluminum oxide comprises heating the aluminum oxide without heating the glass substrate.

* * * * *